(12) United States Patent
Ravi et al.

(10) Patent No.: US 8,390,349 B1
(45) Date of Patent: Mar. 5, 2013

(54) SUB-PICOSECOND RESOLUTION SEGMENTED RE-CIRCULATING STOCHASTIC TIME-TO-DIGITAL CONVERTER

(75) Inventors: Ashoke Ravi, Hillsboro, OR (US); Ofir Degani, Haifa (IL); Hyung Seok Kim, Portland, OR (US); Hasnain Lakdawala, Portland, OR (US); Yee W. Li, Hillsboro, OR (US); Paolo Madoglio, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/533,341

(22) Filed: Jun. 26, 2012

(51) Int. Cl.
*H03L 7/06* (2006.01)
(52) U.S. Cl. ..................... 327/156; 327/147
(58) Field of Classification Search .............. 327/147, 327/156
See application file for complete search history.

(56) References Cited

U.S. PATENT DOCUMENTS

| | | | | |
|---|---|---|---|---|
| 5,534,809 A | * | 7/1996 | Watanabe et al. | 327/269 |
| 7,332,973 B2 | * | 2/2008 | Lee et al. | 331/25 |
| 8,138,843 B2 | * | 3/2012 | Straayer et al. | 331/57 |
| 2005/0259239 A1 | * | 11/2005 | Lin et al. | 356/5.01 |
| 2006/0103566 A1 | * | 5/2006 | Vemulapalli et al. | 341/155 |
| 2009/0322574 A1 | * | 12/2009 | Rivoir | 341/120 |
| 2011/0187907 A1 | * | 8/2011 | Takahashi | 348/302 |
| 2011/0234270 A1 | * | 9/2011 | Kobayashi | 327/156 |
| 2011/0248874 A1 | * | 10/2011 | Cannillo et al. | 341/118 |
| 2011/0282625 A1 | * | 11/2011 | Craninckx et al. | 702/178 |
| 2012/0161831 A1 | * | 6/2012 | Ravi et al. | 327/156 |
| 2012/0262240 A1 | * | 10/2012 | Cremonesi et al. | 331/57 |

* cited by examiner

*Primary Examiner* — Adam Houston
(74) *Attorney, Agent, or Firm* — Ellis B. Ramirez; Prass LLP (57) ABSTRACT

Disclosed is a method and apparatus to extend TDC resolution to better than 1 ps without incurring a matching and power penalty. Higher resolution can be achieved by segmenting the resolution between a mismatch free re-circulating time-to-digital converter (RTDC) and a stochastic time-to-digital converter (STDC). The disclosed RTDC replicates the same delay element to eliminate mismatch with the required dynamic range (200 ps for a 5 GHz example) and moderate resolution (3-5 ps typical corresponding to 6-7 bits for the 5 GHz case). While the STDC can achieve a resolution of 50 fs but with a range of only 3-5 ps which also corresponds to approximately 6-7 additional bits by exploiting process variations and mismatch to achieve a very fine resolution with limited dynamic range.

26 Claims, 7 Drawing Sheets

SUB-PICOSECOND RESOLUTION SEGMENTED RE-CIRCULATING STOCHASTIC TIME-TO-DIGITAL CONVERTER

BACKGROUND

1. Field of the Disclosed Embodiments

The present invention relates generally to high-resolution time-to-digital converter (TDC) and more particularly to a method and apparatus for exploiting process mismatch to improve resolution.

2. Introduction

Many electronic devices operate off a periodic clock signal to synchronize the transmission of data between electronic components within the device. Periodic clock signals can be provided by an oscillator, such as voltage controlled oscillator (VCO/DCO) or digitally controlled oscillator (DCO). Periodic clock signals are also used in radio devices and wireless devices to generate specified frequencies that can be used for a variety of purposes including upconversion, downconversion, and transmission on a carrier frequency. A wireless communication device may be allocated a specified range of frequency bands in which data is transmitted. A VCO/DCO can be used in a phase-locked loop (PLL) to generate various frequency bands. A time-to-digital converter (TDC) can be used in a phase-locked loop (PLL) to lock the frequency of the VCO/DCO to specified frequency.

A wireless communication device for emerging gigabit per second wireless standards require local oscillator (LO) signals with very good spectral purity. Digital fractional-n PLLs are an attractive choice for LO generation in high performance radio transceivers on account of the small area, ease of porting, PVT (process, voltage and temperature) insensitive loop dynamics and scan programmability/re-configurability. The resolution and linearity of the Time-Digital Converter (TDC) limit the spectral purity achievable with a digital fractional-n PLL. As an example, a fractional-n PLL for the 5 GHz band requires the TDC to span a dynamic range of two hundred picoseconds (ps). At the same time, the TDC resolution and non-linearity are required to be better than 1 ps in order to meet the phase noise and spur requirements of the Gbps standards.

A conventional digital PLL achieves a sub-gate delay TDC resolution through the use of techniques such as delay verniers or delay interpolation. Mismatch and variations along the TDC delay line can introduce non-linearity and non-monotonicity in the TDC behavior, effectively degrading the PLL performance. The TDC delay cells will have to be sized up to reduce mismatch and variations. Consequently, the power dissipation increases quadratically with resolution, rendering the design impractical.

SOME EXAMPLE EMBODIMENTS

Therefore, there is a need for an approach to extend the TDC resolution to better than 1 ps without incurring a matching and power penalty. Higher resolution can be achieved by segmenting the resolution between a mismatch free re-circulating time-to-digital converter (RTDC) and a stochastic time-to-digital converter (STDC). The disclosed RTDC replicates the same delay element to eliminate mismatch while achieving the required dynamic range of 200 ps (for the 5 GHz example above) with a resolution of 3-5 ps, corresponding to 6-bits. While the STDC can achieve a resolution of 50 fs but with a range of only 3-5 ps, which also corresponds to approximately 6-7 additional bits, by exploiting process variations and mismatch to achieve a very fine resolution with limited dynamic range.

According to one embodiment, a time-to-digital converter (TDC), comprising a shift-register module configured to store, in a plurality of latches, samples of the VCO/DCO signal clocked by a periodic ring oscillator signal, wherein each latch is configured to generate an output of the sample, and each latch output represents an encoding of the quantized time difference between the VCO signal and the periodic ring oscillator signal; and a plurality of decision units (comparators/arbiters/flip-flops/latches), with the decision units having first and second input ports and an output port providing an output signal, each first input port of the plurality of decision units connected to the VCO/DCO signal and each second input port of the plurality of decision units connected to the ring oscillator signal, wherein the output signal is indicative of difference between the VCO/DCO signal and the ring oscillator signal; wherein the outputs from the shift-register module and the plurality of decision units are combined to provide a high resolution output.

According to another embodiment, a method for time-to-digital conversion (TDC) that comprises a ring oscillator which when triggered by a reference signal edge, produces a clock with a period that is a selected ratio of a voltage-controlled oscillator (VCO/DCO) period; sampling and storing in a plurality of register elements a VCO/DCO signal clocked by the periodic ring oscillator signal, wherein each delay element is configured to store the sample for a different time interval; stochastically processing with a plurality of decision units a VCO/DCO signal clocked by the periodic ring oscillator signal, some decision units having first and second input ports and an output port providing an output signal, each first input port of the plurality of decision units connected to the VCO/DCO signal and each second input port of the plurality of decision units connected to the ring oscillator signal; and IF the VCO/DCO signal and the ring oscillator signal are almost aligned THEN combining the stored register sample for the time interval and the stochastically processed output signal to provide a high resolution TDC output signal.

According to one embodiment, an all-digital phase locked loop (ADPLL), comprising a digital phase/frequency detector configured to integrate frequency error obtained by comparing a target frequency word input to a differentiated TDC output in a feedback loop which is proportional to a frequency difference between the frequency word and the differentiated TDC output; a digital loop filter configured to generate a filtered phase error signal by low-pass filtering the phase error signal; a VCO/DCO configured to generate a periodic VCO/DCO signal at a specified frequency, wherein the voltage or digital input is used to converge the VCO/DCO frequency to the specified frequency; a shift-register module configured to store, in a plurality of latches, samples of the periodic VCO/DCO signal clocked a periodic ring oscillator signal, wherein each latch is configured to generate an output of the sample, and each latch output represents a time difference polarity between the periodic VCO/DCO signal and the periodic ring oscillator signal; and a plurality of decision units, some decision unit having first and second input ports and an output port providing an output signal, each first input port of the plurality of decision units connected to the periodic VCO/DCO signal and each second input port of the plurality of decision units connected to the ring oscillator signal, wherein the output signal is indicative of variations between the periodic VCO/DCO signal and the ring oscillator signal; an adder configured to generate a TDC output signal which combines the latch output from the delay module and the output signal from the plurality of decision units; and a differentiator configured to generate the differentiated TDC output by differentiating the TDC output signal.

According to another embodiment, a non-transitory machine-accessible medium that provides instructions, which when accessed, cause a machine to perform operations, the non-transitory machine-accessible medium comprising code for causing at least one computer to, when triggered by a reference signal edge, clock from a triggered reference ring oscillator a periodic ring oscillator signal with a ring oscillator period that is a selected ratio of a voltage-controlled oscillator (VCO/DCO) period; code for causing at least one computer to sample and store in a plurality delay elements a VCO/DCO signal clocked by the periodic ring oscillator signal, wherein each delay element is configured to store the sample for a different time interval; code for causing at least one computer to stochastically process with a plurality of decision units a VCO/DCO signal clocked by the periodic ring oscillator signal, some decision unit having first and second input ports and an output port providing an output signal, each first input port of the plurality of decision units connected to the VCO/DCO signal and each second input port of the plurality of decision units connected to the ring oscillator signal; and code for causing at least one computer to perform the conditional statement that IF the VCO/DCO signal and the ring oscillator signal are almost aligned THEN combining the store sample for a different time interval and the stochastically processed output signal to provide a high resolution TDC output signal.

According to yet another embodiment, A time-to-digital converter (TDC) comprising a voltage controlled oscillator (VCO/DCO) to output a VCO/DCO signal; a chain of cascaded delay elements configured to cumulatively delay the VCO/DCO signal to generate signals having respective delay amounts; and a plurality of decision units, some decision unit having first and second input ports and an output port providing an output signal, each first input port of the plurality of decision units connected to a respective delay amounts and each second input port of the plurality of decision units connected to a reference oscillator signal, wherein the output signal is indicative of time difference between the respective delay amounts and the reference oscillator signal; wherein the outputs from the chain of cascaded delay elements and the plurality of decision units are combined to provide a high resolution output.

Exemplary embodiments are described herein. It is envisioned, however, that any system that incorporates features of any apparatus, method and/or system described herein are encompassed by the scope and spirit of the exemplary embodiments.

DETAILED DESCRIPTION OF THE DISCLOSED EMBODIMENTS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Additional features and advantages of the disclosure will be set forth in the description which follows, and in part will be obvious from the description, or may be learned by practice of the disclosure. The features and advantages of the disclosure may be realized and obtained by means of the instruments and combinations particularly pointed out in the appended claims. These and other features of the present disclosure will become more fully apparent from the following description and appended claims, or may be learned by the practice of the disclosure as set forth herein.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Although embodiments of the invention are not limited in this regard, discussions utilizing terms such as, for example, "processing," "computing," "calculating," "determining," "applying," "receiving," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of resistors" may include two or more resistors.

The term "controller" is used herein generally to describe various apparatus relating to the operation of one or more device that directs or regulates a process or machine. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

The term "mobile communication device" as used herein includes, for example, a device capable of wireless communication, a communication device capable of wireless communication, a mobile terminal, a communication station capable of wireless communication, a portable or non-portable device capable of wireless communication, mobile terminal, or the like. In some embodiments, a wireless device may be or may include a peripheral device that is integrated with a computer, or a peripheral device that is attached to a computer. In some embodiments, the term "wireless device" may optionally include a wireless service.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Figure 1:
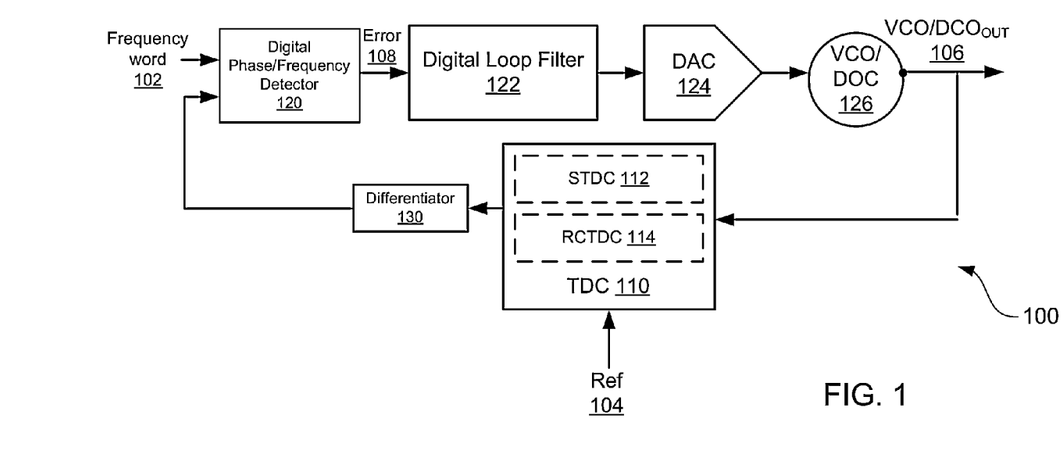
FIG. 1 illustrates a block diagram of an all-digital phase locked loop (ADPLL) with VCO/DCO oscillator in accordance to an embodiment.
Figure 2:
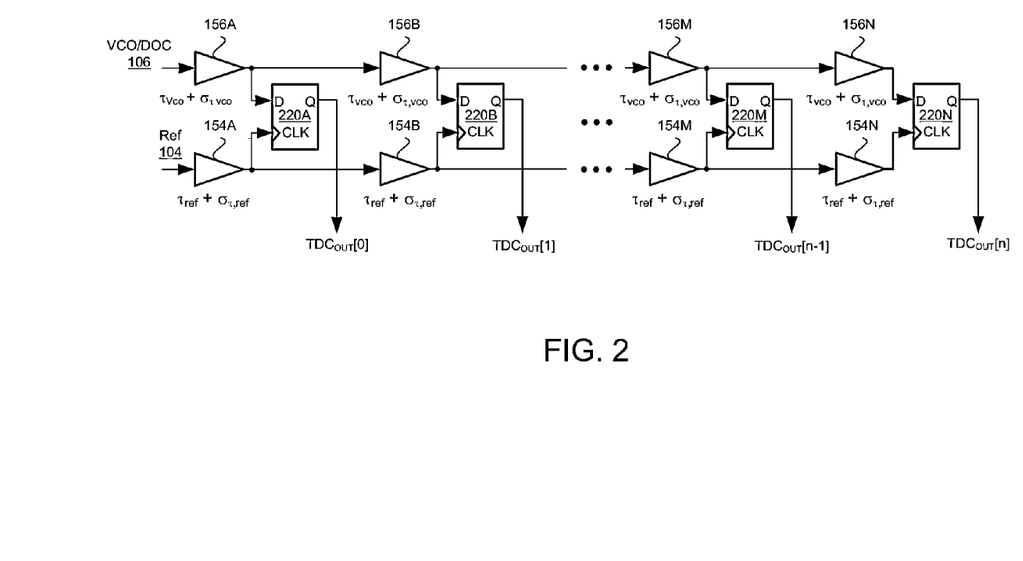
FIG. 2 illustrates a block diagram of a Vernier time-to-digital converter (TDC) in accordance to an embodiment.

For an all-digital phase locked loops (ADPLLs), a time-to-digital converter (TDC) can be used for converting phase information of a voltage-controlled oscillator (VCO/DCO) into a digital domain. FIG. 1 illustrates an ADPLL 100 architecture suitable for fractional-n operation which can include a TDC 110. The TDC may include a stochastic time-to-digital converter (STDC) 112 as described in FIG. 4 and an re-circulating time-to-digital converter (RTDC) 114 as described in FIG. 3A or a STDC 112 with a Vernier TDC as shown in FIG. 2. Additional circuitry can include a digital phase/frequency detector 120, a digital loop filter 122, a digital-to-analog converter (DAC) 124, a voltage-controlled oscillator (VCO) 126, and a differentiator 130. The digital phase/frequency detector 120 can integrate frequency error 108 by comparing a frequency word input to a differentiated TDC output in a feedback loop which can be proportional to a frequency difference between the frequency word 102 and the segmented TDC output. In order to achieve the sub-gate-delay resolution used in many wireless standards, the TDC may be implemented as a delay Vernier. The Vernier TDC can be analogous to a flash analog-to-digital converter but operating in the time domain. As shown in FIG. 2, the Vernier TDC can include delay cells 156A-B, 156M-N, 154A-B, and 154M-N and sampling flip-flops (FF) 220A-B and 220M-N. The Vernier TDC can include an n number of FF and an 2n number of delay cells or delay elements. The output of the plurality of the FFs can generate a different output with each triggering edge of the reference signal. The TDC resolution can determined by a difference between the VCO/DCO delay ($\tau_{VCO}$) of the VCO/DCO signal 106 and the reference delay (tref) of the reference signal (REF) 104 and the FFs can perform a time comparison. However, due to variations ($\sigma\tau$, vco and $\sigma\tau$, ref) in the delay cells as well as setup/hold time variations in the FFs, the Vernier TDC can have nonlinear characteristics. The variations can create low-frequency tones and cause noise folding, which can increase the phase noise at an ADPLL output. To reduce the nonlinearity due to variations, the TDC delay cells may be matched together, such as delay cell 156A for the VCO/DCO signal matched with the delay cell 156B,M,N for the VCO/DCO signal, and delay cell 154A for the reference signal matched with the delay cell 154B,M,N for the reference signal. In order to reduce non-linearities from the mismatch of delay cells, the delay cells in the Vernier TDC may be sized up (where the component's features and process dimensions are larger than other similar components using the same process), which can lead to a large area and high power consumption for the TDC. As a result, the TDC may occupy a relatively large area of a silicon die and consume a relatively large amount of power, becoming a power-hungry block of a circuit. Moreover, the Vernier TDC does not scale well with process scaling, like other digital circuits, due to a need to maintain adequate matching between the delay cells. Consequently, the power dissipation and area overhead can become a bottleneck to scaling. A re-circulating TDC can provide a scaling compatible, low-power, and mismatch and process, voltage and temperature (PVT) insensitive TDC.

The nonlinearity of TDCs, such as a Vernier TDC, can be corrected by dithering. The amount of dithering can be set by an integral non-linearity (INL) of the TDC. Since the TDC can span at least one complete VCO/DCO period in fractional-n synthesizers, the number of delay stages or delay elements in high resolution TDCs can be large. The number of delay stages can have the effect of worsening the INL. The amount of dithering used to linearize the TDC can then increase the white noise level in the PLL defeating an objective of attaining lower phase noise through increased TDC resolution. White noise can be a random signal (or process) with a flat power spectral density as known to those in the art. In other words, the white noise can contain equal power within a fixed bandwidth at any center frequency. Another process to correct the nonlinearity of TDCs can be using digital back-end calibration. In digital back-end calibration, TDC non-linearity can be measured and then the non-linearity can be calibrated digitally. However, digital back-end calibration can use a memory and complex digital back-end calibration circuits also resulting in relatively large silicon area. In addition, digital back-end calibrations can be sensitive to temperature drifts and supply changes and may not be practical to implement in devices with specified or rigid standards, where the devices may be always connected, such as cellular receivers.

A re-circulating TDC (RCTDC) and an associated method can be used to provide time-to-digital conversion with reduced TDC non-linearity. The re-circulating TDC can provide an area efficient, low-power, scalable TDC with reduced process, voltage and temperature (PVT) variation sensitivity. However, it will require more cycles to complete the conversion. On the other hand, the conversion must be completed by the time the next reference edge arrives to avoid sub-sampling in the TDC. Therefore, this architecture suffers from a limit on the finest achievable resolution. In an example, the re-circulating TDC can re-use a single delay cell and sampling flip-flop for the time comparison. In another example, the delay cell can be configured as a triggered ring oscillator with a fixed period which can be slightly shorter or longer than VCO/DCO period. Through reusing the delay cell the TDC can achieve linear characteristics with a much smaller area and power consumption compared with a conventional TDC, such as the Vernier TDC. In another configuration, the frequency locking used for the triggered ring oscillator period adjustment can be performed in digital domain and thus the triggered ring oscillator period adjustment can be automatically calculated and routed to the triggered ring oscillator. In another example, the embedded counting system of the TDC can minimize the power consumption and area overheads of a frequency locking mechanism.

Figure 3A:
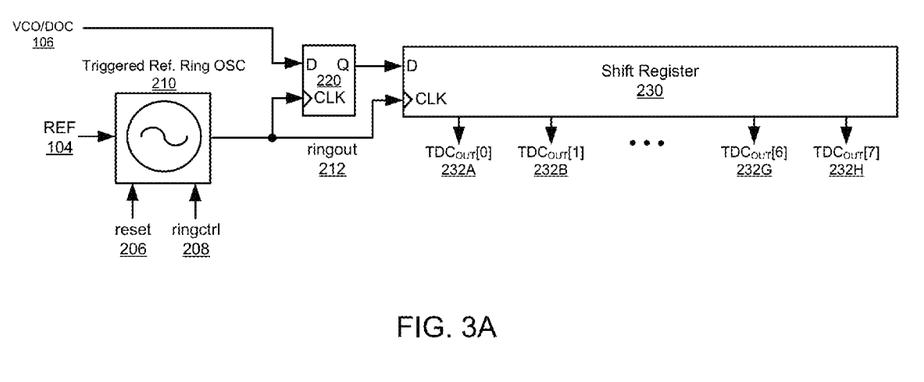
FIG. 3A illustrates a block diagram of a triggered reference ring oscillator for a re-circulating time-to-digital converter (TDC) in accordance to an embodiment.

The following provides additional details of the examples. In an example, the re-circulating TDC can re-use a single delay cell and flip-flops (FF). FIG. 3A illustrates an example of the re-circulating TDC (RCTDC). For simplicity of illustration, the re-circulating TDC can comprise a 3-bit re-circulating TDC. On the rising edge of the reference clock, the ring is triggered and starts oscillating. The re-circulating TDC can include a triggered reference ring oscillator 210 (Ref. Ring OSC), a latch 220 (e.g., a FF) or sampling flip-flop, and a delay module (e.g., a shift register 230) such as a shift register to collect the samples. The delay module is comprised of circuit elements selected from a group consisting of delay cell, flip-flop, array of delay elements, shift registers, or a combination thereof. The triggered reference ring oscillator can include an enabled control input, a reset 206 control input, and ringctrl 208 control input. A latch, such as a flip-flop, can be a circuit that has two stable states. The latch can be used to store state information. The latch can be made to change state by signals applied to one or more control inputs and the latch can have one or two outputs. Latches can be used as data storage elements. Edge-triggered latches can be clocked by an edge of a control input. A data or delay flip-flop (D flip-flop) can have an input D, a control clock input clk, an output Q. The latch or flip-flop may also include a control set/reset input. A shift register can include a cascade of latches, such as flip flops, sharing a same clock, which can have an output of any one of the latches but the last latches connected to the "data" (D) input of the next one in a chain. The shift register can provide a state value (e.g., a logic low, a logic high, a digital "0", or a digital "1") that shifts by one position in a one-dimensional "bit array" stored in the circuit. The shift register can shift in the data present at the shift register input and shifting out the last bit in the array, when enabled to do so by a transition of the clock input. Shift registers can have both parallel and serial inputs and outputs. Although, latches, flip-flops, and shift registers are specifically described, other circuits performing the same function described herein may also be used.

Figure 3B:
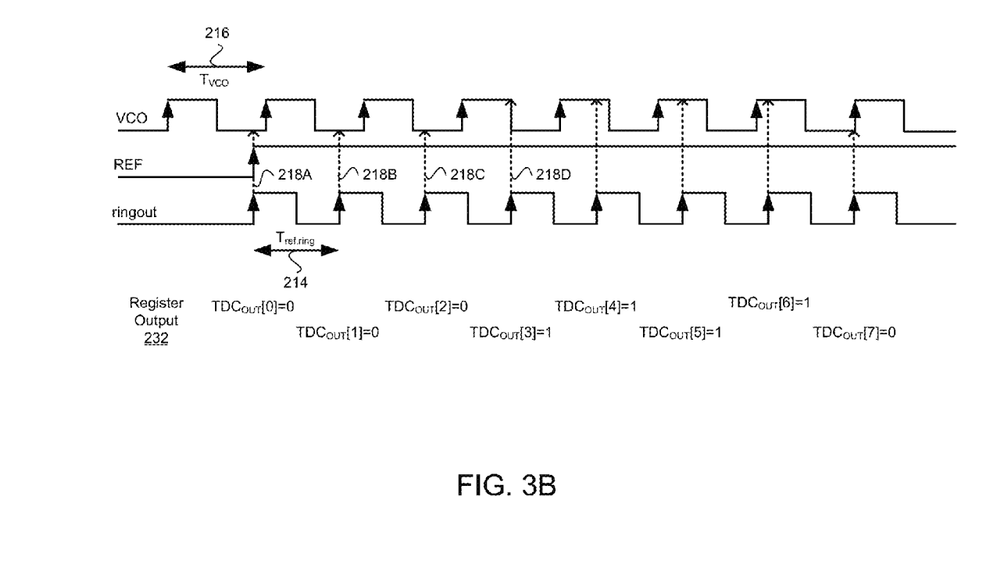
FIG. 3B illustrates a timing diagram of sampling a voltage-controlled oscillator (VCO/DCO) signal using a periodic ring oscillator signal of a triggered reference ring oscillator in accordance with an example.

In an example, when the reference signal REF 104 transitions from low to high, the triggered Ref. Ring OSC 210 starts oscillating generating a periodic ring oscillator signal 212. The periodic ring oscillator signal with a ring oscillator period can be a selected ratio of a voltage-controlled oscillator (VCO/DCO) period Tvco 216, as illustrated in FIG. 3B. For example, if the period of the Ref. Ring OSC, Tref.ring 214, is set to (7/8)Tvco, the time difference between the VCO/DCO signal 106 rising edge and the Ref. Ring OSC signal rising edge decreases by (1/8)Tvco every cycle. The FF may be clocked by the rising edge of the periodic ring oscillator signal (e.g., an output ringout 212 of triggered Ref. Ring OSC), which can store a sample of the VCO/DCO signal. The FF 220 compares the VCO/DCO phase with the output ringout of triggered Ref. Ring OSC rising edge and the FF output is stored in the shift register as a sample and the sample value or state value shifts within the shift register for different sequential time intervals. Each FF output can represent an encoding of the quantized time difference between the VCO/DCO signal and the periodic ring oscillator signal. For example, at a first ringout rising edge 218A, the shift register output [TDCOUT[0]=0] can store a logic low. At a second ringout rising edge 218B, the shift register output [TDCOUT[1]=0] can store a logic low. At a third ringout rising edge 218C, the shift register output [TDCOUT[2]=0] can store a logic low. At a fourth ringout rising edge 218D, the shift register output [TDCOUT[3]=1] can store a logic high, and so on. After the eighth (8th) cycle of the Ref. Ring OSC, the triggered reference ring oscillator and the ringout can be disabled and the output 232A-H of the shift register can be maintain until the next REF rising edge. In the example illustrated in FIG. 3B, the shift register output is 00011110. By finding high to low transition, the phase of the VCO/DCO signal relative to the reference signal can be decoded. In FIG. 3B, the position of the high to low transition is 6. The transition can represent (6/8)Tvco time difference between the VCO/DCO and REF rising edge. The TDC can be linear, which can be minimally affected by random thermal/flicker noise. Since the Ref. Ring OSC can be reset after a pre-determined number of cycles (e.g., 8 cycles in FIG. 3B), the oscillator may not be free running oscillator. Therefore the phase noise of the oscillator may not accumulate indefinitely as in a normal ring oscillator and the triggered reference ring oscillator may be no worse than a Vernier TDC for phase noise. Although the example in FIG. 3B, clocks the samples on a rising edge, the sample may also be clocked on a negative edge.

In another example, the period of the Ref. Ring OSC, Tref.ring, can be set to (9/8)Tvco., which can work in a similar manner to the example of FIG. 3B, but where the time difference between the VCO/DCO signal 106 rising edge and the Ref. Ring OSC signal rising edge increases by (1/8)Tvco every cycle. Since TDC measures the negative of the phase difference (when Tref.ring, is set to (9/8)Tvco), the PLL may flip the polarity of the phase comparison to correct for the negative of the phase difference.

The ring oscillator period can be shorter or longer than the VCO/DCO period. The ring oscillator period Tref.ring can be represented by (Ns±1)/Ns*Tvco, where Tvco is the VCO/DCO period, Ns is a TDC sample number, and the TDC sample number is a positive integer of samples per the VCO/DCO period. For a re-circulating TDC with a resolution of B-bits, the TDC sample number Ns can represented by $2^B$. For a B-bit re-circulating TDC, Tref,ring can be set to $(2^B \pm 1)/2^B \cdot \text{Tvco}$ and ring oscillator period may be automatically adjusted with respect to the ADPLL VCO/DCO frequency. Without loss of generality, Tref,ring can be set to $(2^B-1)/2^B \cdot \text{Tvco}$. In another example (not described), $(2^B+1)/2^B \cdot \text{Tvco}$ may be used. By monitoring an instantaneous VCO/DCO period Tpn normalized to the TDC resolution ($\text{Tvco}/2^B$), the ring oscillator period Tref.ring can be adjusted to a correct value. The operations to set the correct value for Tref.ring can easily be performed in digital domain such as with a programmed processor. If the ring oscillator period, Tref-ring, is adjusted to (1−1/Ns)·Tvco, then the time difference between the VCO/DCO 106 and reference ring oscillator reduces by (1/Ns)Tvco every cycle. This is the effective resolution of the re-circulating TDC (RTDC). The flip-flop 220 samples the VCO/DCO state against the reference ring transitions 212 and stores the results in the shift register 230. Up to q (>=Ns) samples are required in order to capture the dynamic range required to support fractional-n operation (one complete VCO/DCO period). After q samples are collected, the reference ring is reset 206 and awaits the next reference edge 104. Through reusing the delay cell the TDC can achieve perfectly linear characteristic with much smaller area and power consumption compared to a conventional TDC. In order to support a finer resolution, the period of the reference ring oscillator can be made closer to the VCO/DCO period. However, it will require more cycles to complete the conversion.

Figure 5:
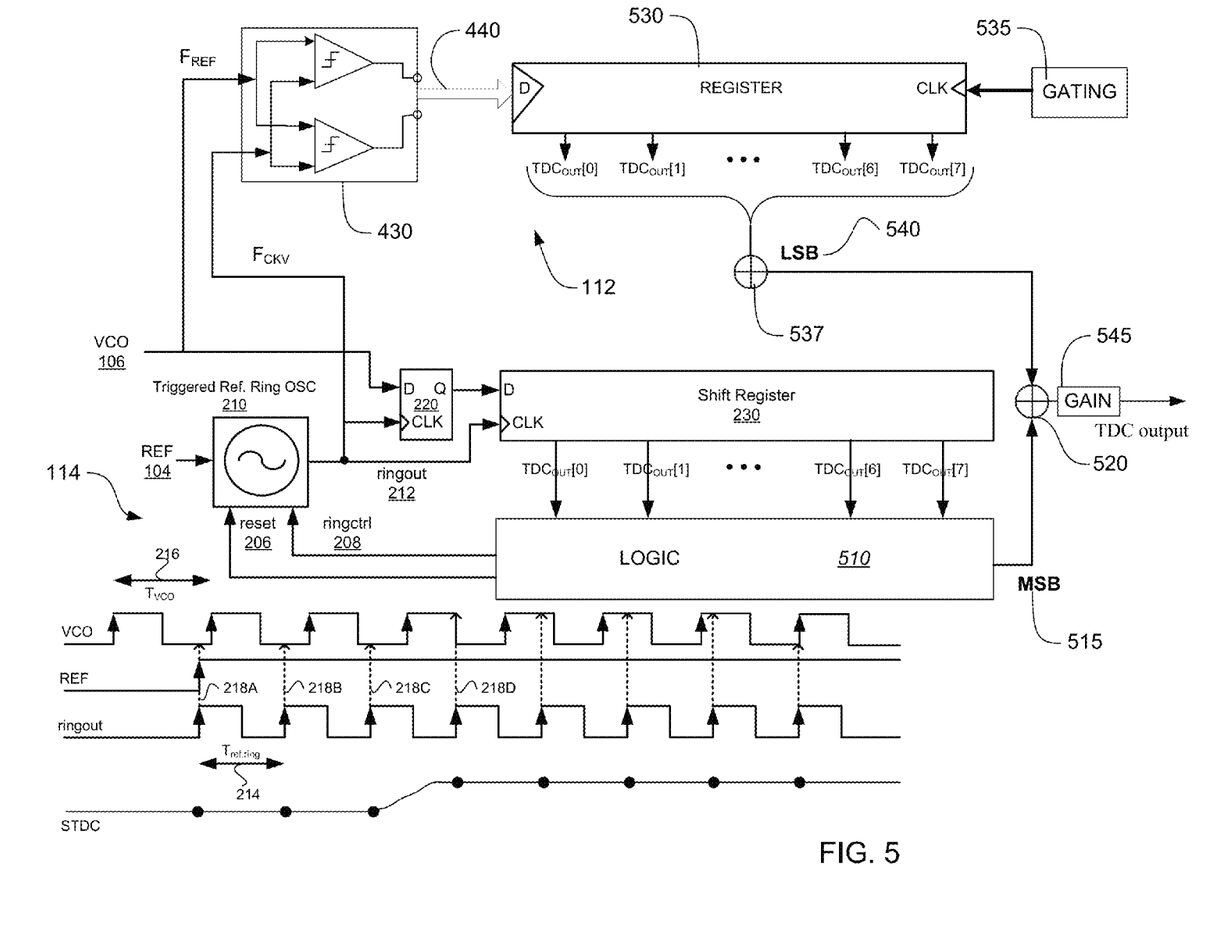
FIG. 5 illustrates the operation of the re-circulating stochastic TDC in accordance to an embodiment.

To speed up an initial frequency acquisition, the reference ring oscillator can be characterized at a few discrete tuning settings by triggering the reference ring oscillator and measuring the frequency of oscillation through a counter. A logic unit such as logic unit 510 in FIG. 5 is used to find the setting. The frequency measurement can be performed in production testing or on a power up of the reference ring oscillator and stored on a memory (e.g., a read-only memory [ROM] or a random access memory [RAM]). From settings derived from frequency measurements, an initial estimation for a desired channel frequency can be interpolated. The initial estimation and interpolation can reduce the amount of time used for a frequency locking loop to converge. The re-circulating TDC may also prevent a feedback loop of a reference ring control signal 208 and/or a feedback loop of a PPL from locking to the other stable equilibrium point of $(2^B+1)/2^B \cdot Tvco$, which can also be used when the phase measurements are inverted. The Ref. Ring OSC output ringout can be sampled on quadrature phases of the VCO/DCO in a quadri-correlator to determine which of the two frequencies (i.e., a VCO/DCO signal frequency or a periodic ring oscillator signal frequency) is higher and maintaining one signal frequency higher than the other signal frequency. For example, the re-circulating TDC can reset Tref.ring to a minimum delay setting if Tref.ring drifts to become larger than Tvco.

Figure 4:
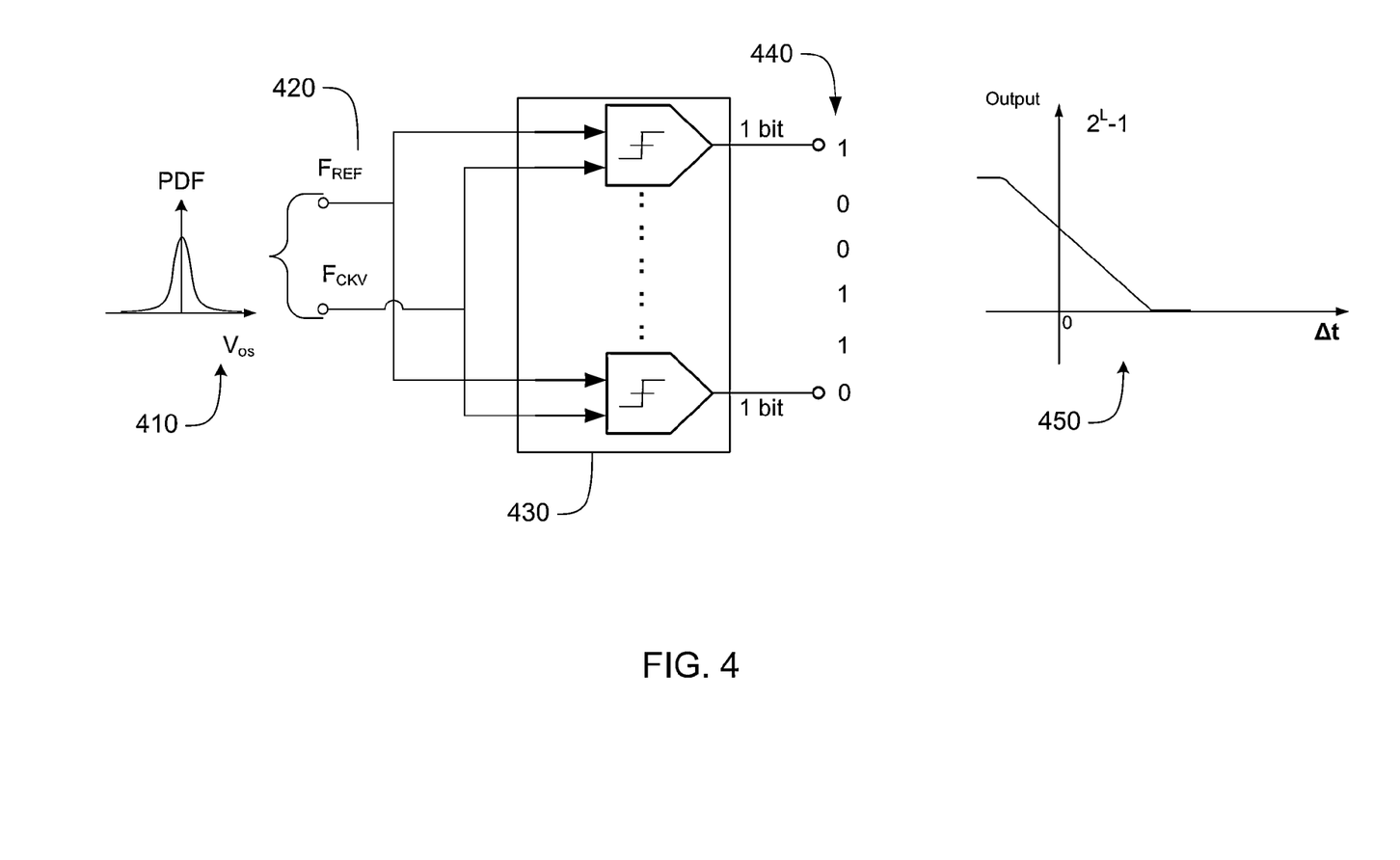
FIG. 4 illustrates a block diagram of a stochastic time-to-digital converter in accordance to an embodiment.

FIG. 4 illustrates a block diagram of a stochastic time-to-digital converter in accordance to an embodiment. It consists of an array of logic units or decision units 430 such as flip-flops or latches called arbiters (ARBs) and an encoder and/or adder (Not shown) to store the values. The plurality of decision units 430 comprise elements selected from a group consisting of flip-flop, comparator, latch, arbiter, register, adder, or combination thereof. The STDC is based on the stochastic properties of materials, for example each arbiter from the set, given the same input signals 410, $F_{REF}$ and $F_{CKV}$, will react differently because they exhibit finite random mismatches resulting from process variations. Some of the arbiters output would yield 1's and some of them 0's, even if the two input edges were lined up equally. The input is shown as a probability density function 410 because the inputs ($F_{REF}$, $F_{CKV}$) arrive in a random order exhibiting a Gaussian distribution. Based on the number of ones and zeros, the time difference (FREF-FCKV) between the rising edges of signals is digitized such as shown as output 440. The digitized value is sufficiently linear as shown by function 450 due to the inherent statistical distribution of process variations. The improved linearity of the fine loop due to the STDC results in a phase lock loop (ADPLL) with a bandwidth that is independent of input jitter amplitude. In an embodiment, the VCO/DCO signal is fed to the data port ($F_{REF}$) of the array and the reference ring signal to the clock port ($F_{CKV}$). In the presence of variations, the sampling instant of each flip-flop is skewed from the nominal or mean of the observations as measured at output port 440. When the VCO/DCO and reference ring signals (rising edges or $F_{REF}=F_{CKV}$) are aligned, then statistically, half the flip-flops will resolve a "1" and half a "0". As we sweep the distance between the edges more (or less) flip-flops will resolve to a "1". For large distances between the edges (such as when $|F_{REF}|>>|F_{CKV}|$) all the flip-flops will resolve a "1" or "0" depending on the polarity of the difference. The outputs of all the flip-flops are averaged in order to decode the output. The resolution of the stochastic TDC is set by the number of flip-flops in the array while the dynamic range is limited by the width of the tails of the statistical distribution. The flip-flops can be minimum size to maximize the variations and minimize power consumption. The stochastic TDC therefore exploits process variations and mismatch to achieve a very fine resolution with limited dynamic range. The resolution is set by the number of flip-flops (arbiters). The dynamic range is limited by the width of the probability distribution.

FIG. 5 illustrates the operation of the re-circulating stochastic TDC in accordance to an embodiment. In the illustrated embodiment, the required dynamic range is segmented between the re-circulating TDC (RCTDC 114) and the stochastic TDC (STDC 112). The STDC 112 can serve as a least significant bit (LSB) 540 of the TDC output and RCTDC 114 can serve as the most significant bit (MSB) 515 of the TDC output. The RCTDC 114 measures the difference between the reference edge (ringout 212) and the nearest VCO/DCO edge (VCO/DCO 106) with a coarse resolution but covers delays of up to one VCO/DCO period. The STDC 112 provides the fine resolution where the aim is to increase the resolution of time detection beyond a single inverter delay, which is the best that can be expected from the inverter chain approach used in the coarse loop. It covers a dynamic range a little greater than the re-circulating TDC step size (resolution) in order to have sufficient overlap. For most of the conversion steps, the difference between the two edges is so large that the stochastic TDC is saturated at "1" or "0". As the two edges get closer, the stochastic TDC produces finer intermediate measures. The illustrated circuit (TDC 110) detects (output 440) at STDC 112 and capture (register 530) only these finer intermediate measures in order to minimize the data storage requirements. The outputs of the two TDCs are combined (adder 520) with appropriate gain scaling (gain 545) to obtain the high resolution output for a TDC output. The required gain scaling is easily extracted from the finer measures of the stochastic TDC since these were captured at delays separated by the coarse TDC steps.

When the two input ports (edges of $F_{REF}$ and $F_{CKV}$) have a considerably large phase error between them, such that all of the latches unambiguously state edge $F_{REF}$ (VCO/DCO 126) comes earlier than edge $F_{CKV}$ (ringout 212). If this condition is represented by a 1 at the latch outputs (output port 440). This situation would represent the saturation condition where the inputs represent a timing error beyond the STDC dynamic range. Gating 535 would signal register 530 not to save the values since it would be better to use the coarse values from RCTDC 114. As the phase error is reduced, because of the finite rise-time of the input signals as well as the finite voltage offset on the latch inputs, some latches output a 1 while others output a 0. This is because the voltage offset shifts the thresholds of the latches randomly. In this case, the number of 1's will be greater than the number of 0's, and this information is reflected on the output word as an increase in the frequency of VCO/DCO 126. The amount by which the number of 1's exceeds the number of 0's is a measure of the phase error. As the phase error is lowered, this difference will decrease. In the extreme case, where the phase error is exactly zero, roughly half of the latches will state that edge $F_{REF}$ came earlier, while the remaining latches state otherwise, i.e., $F_{CKV}$ came first. The output word will be approximately zero on average (Nominal value), but will fluctuate about this value from edge to edge, which will reflect on the loop filter input. If an infinite number of latches could be used, for zero phase error, exactly half of the latches would output a 1 and the rest a 0. Adder 537 combines the output of register 530 into a single stream (LSB), while logic 510 combines the values from shift register 230 into another stream (MSB). Logic 510 also generates reset 206 and ringctrl 208.

The RCTDC 114 and STDC 112 can be used in wireless radio transceivers for high data-rate standards, such as a third generation partnership project (3GPP) long term evolution (LTE) standard (e.g., 4G(LTE)/5G(LTE-Advanced) cellular), a WiMAX (Worldwide interoperability for Microwave Access or the Institute of Electrical and Electronics Engineers (IEEE) 802.16 standard (e.g., 802.16e, 802.16m)), and a WiFi (IEEE 802.11 standard). The RCTDC 114 and STDC 112 can be used to generate a radio frequency (RF) and used in both stand-alone radios or as part of a system-on-chip (SoC) incorporating one or more wireless protocol. Within a transceiver, RCTDC 114 and STDC 112 can be used in an all digital frequency synthesizer for local oscillator (LO) generation forming a linear transceiver that can also be used in a wireless digital transmitter for phase modulation.

Figure 6:
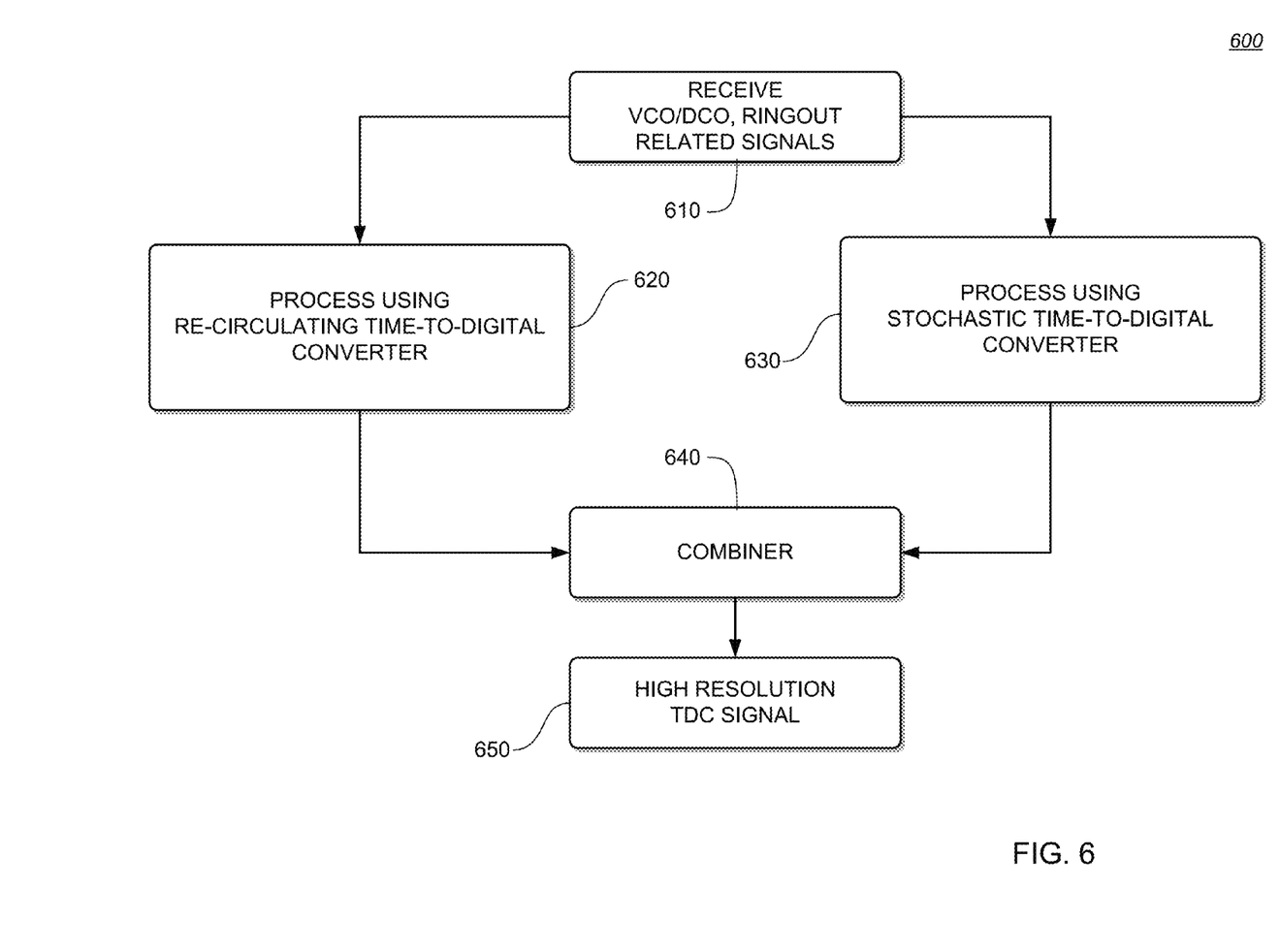
FIG. 6 is a flowchart of a method for time-to-digital conversion using a re-circulating stochastic TDC in accordance to an embodiment.

FIG. 6 is a flowchart of a method 600 for time-to-digital conversion using a re-circulating stochastic TDC in accordance to an embodiment. Method 600 begins with action 610 when each TDC receives the VCO/DCO and the ringout related signals triggered by a reference signal edge(Ref 104), clocking (ringout 212) from a triggered reference ring oscillator a periodic ring oscillator signal with a ring oscillator period that is a selected ratio of a voltage-controlled oscillator (VCO/DCO) period (VCO/DCO 106). Method 600 then segments the received VCO/DCO and ringout related signals to start RCTDC processing 620 and STDC processing 630 to produce at each segment part/all of the TDC output signal. The RCTDC processing 620 performs sampling and storing in a plurality delay elements a VCO/DCO signal clocked by the periodic ring oscillator signal, wherein each delay element is configured to store the sample for a different time interval The STDC processing 630 contains a plurality of decision units to process a VCO/DCO signal clocked by the periodic ring oscillator signal, some decision unit having first and second input ports and an output port providing an output signal, each first input port of the plurality of decision units connected to the VCO/DCO signal and each second input port of the plurality of decision units connected to the ring oscillator signal. The plurality of decision units 430 comprise elements selected from a group consisting of flip-flop, comparator, latch, arbiter, register, adder, or combination thereof. The STDC and RCTDC signals are then send to action 640 for further processing. Action 640 performs combining of the TDC values by applying conditional processing such as IF the VCO/DCO signal and the ring oscillator signal are almost aligned THEN combining the store sample for a different time interval and the stochastically processed output signal to provide a high resolution TDC output signal. Combiner 640 would send the digital phase/Frequency detector 120 the coarse value from RCTDC 114 or value as determined in action 620 and/or the fine value as determined by STDC 112 or action 630. The high resolution TDC signal 650 combined from the values determined in action 620 and action 630 are use to regulate ADPLL 100.

Figure 7:
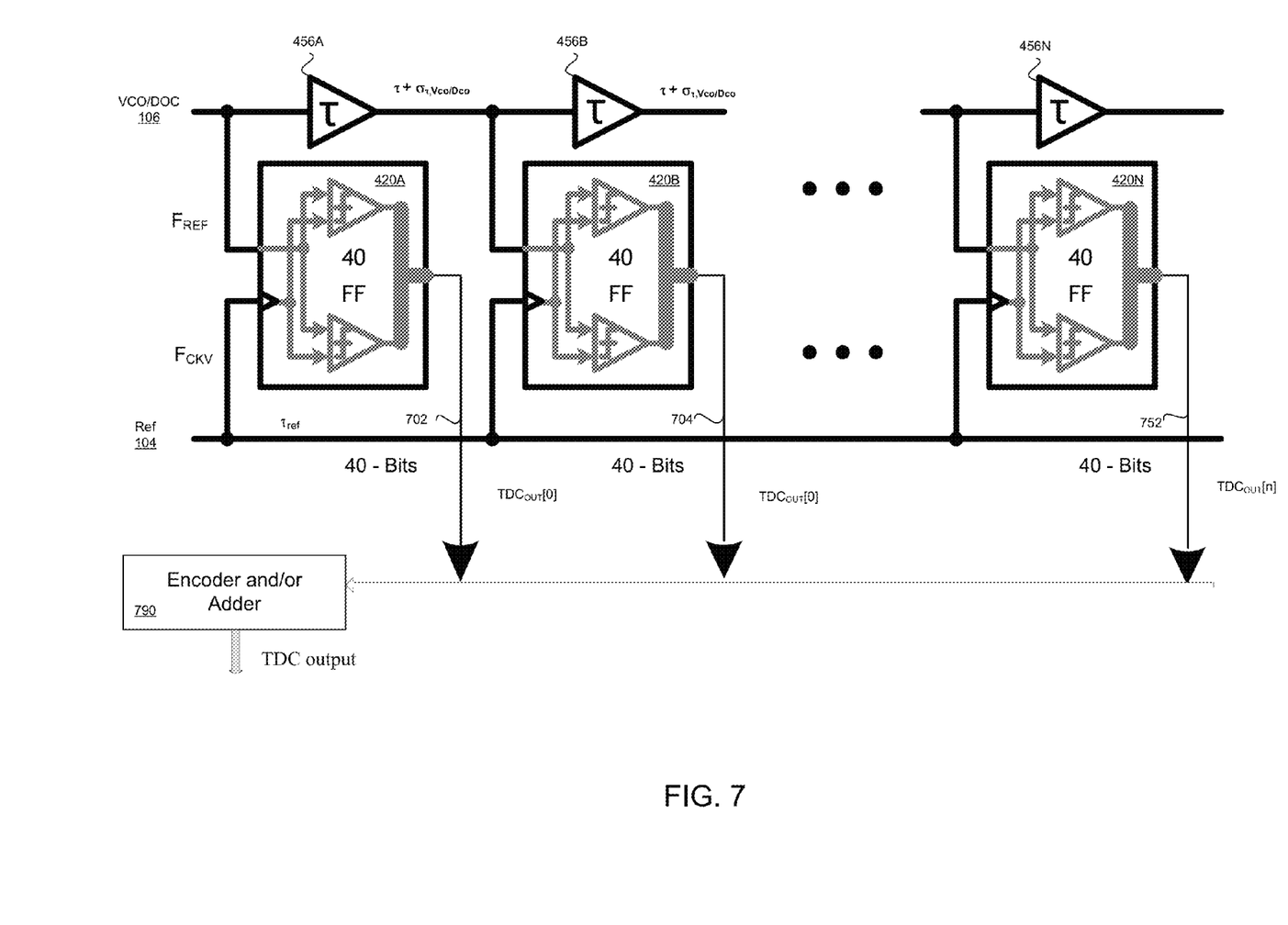
FIG. 7 illustrates a block diagram of a flash TDC and a stochastic TDC in accordance to an embodiment.

FIG. 7 illustrates a block diagram of a flash TDC and a stochastic TDC in accordance to an embodiment. The flash TDC and the stochastic TDC comprise a chain of buffer delays 456A through 456N, and decision unit 420A through 420N. A delay element can be a shift register and the like. Each decision units comprises M logic elements selected from a group consisting of flip-flop, comparator, latch, arbiter, register, adder, or combination thereof. As shown in FIG. 7 the decision unit comprises 40 FFs which produce a 40 bit stream. The input signal to the chain of buffer delays 456A through 456N is the VCO/DCO signal 106 from the VCO/DOC 126 as described in FIG. 1. The output signal from each buffer delay 456A through 456N is fed to one of the decision units 420A through 420N. The chain of buffer delays generates signals having respective delay amounts (τ or tau) each forming part of an input to a decision unit as illustrated. The clock (FCKv) for each of the decision units is the REF 104 signal. While the input of decision unit 420A is shown as VCO/DOC 106 it should be understood that a delay could be included. The output signals from the decision units are shown as M bit parallel stream (M bits corresponding to the number of logic elements which makeup the each decision unit), the first stream (TDCout[0]) 702 coming from the first decision unit 420A, the second stream 704 coming from the second decision unit 420B, and stream 752 coming from the final decision unit 420N. The TDC resolution can be determined by a difference between the VCO/DCO delay ($\tau_{vco}$) of the VCO/DCO signal 106 and the reference delay ($\tau_{ref}$) of the reference signal (REF) 104. Each decision unit performs a time comparison of the signals $F_{REF}$ and $F_{CKV}$ corresponding to VCO/DCO and REF signal respectively It should be noted that variations($\sigma_{\tau,vco}$ and $\sigma_{\tau,ref}$) in the delay cells (456A ... 456N) as well as variations in the decision units can have nonlinear characteristics but can be managed by selecting substantially identical elements. The behavior of the flash TDC can be described as follows, all the N delays are distributed as a normal (or Gaussian) probability density function (PDF) around the nominal (average) value $\tau_0$. The flash TDC transfer function can be approximated by a cumulative distribution function (CDF) like shown in FIG. 4 The resulting resolution is roughly variance divided by the number of elements ($\sigma_{\tau,vco}$/N). In a sixty four (64) decision unit circuit the resulting resolution should be below the one picoseconds requirement set by various Gbps standards. The output of each decision unit (illustrated with 40 FFs each producing one bit) can be accumulated in circuit 790 such as an encoder and/or adder.

Figure 8:
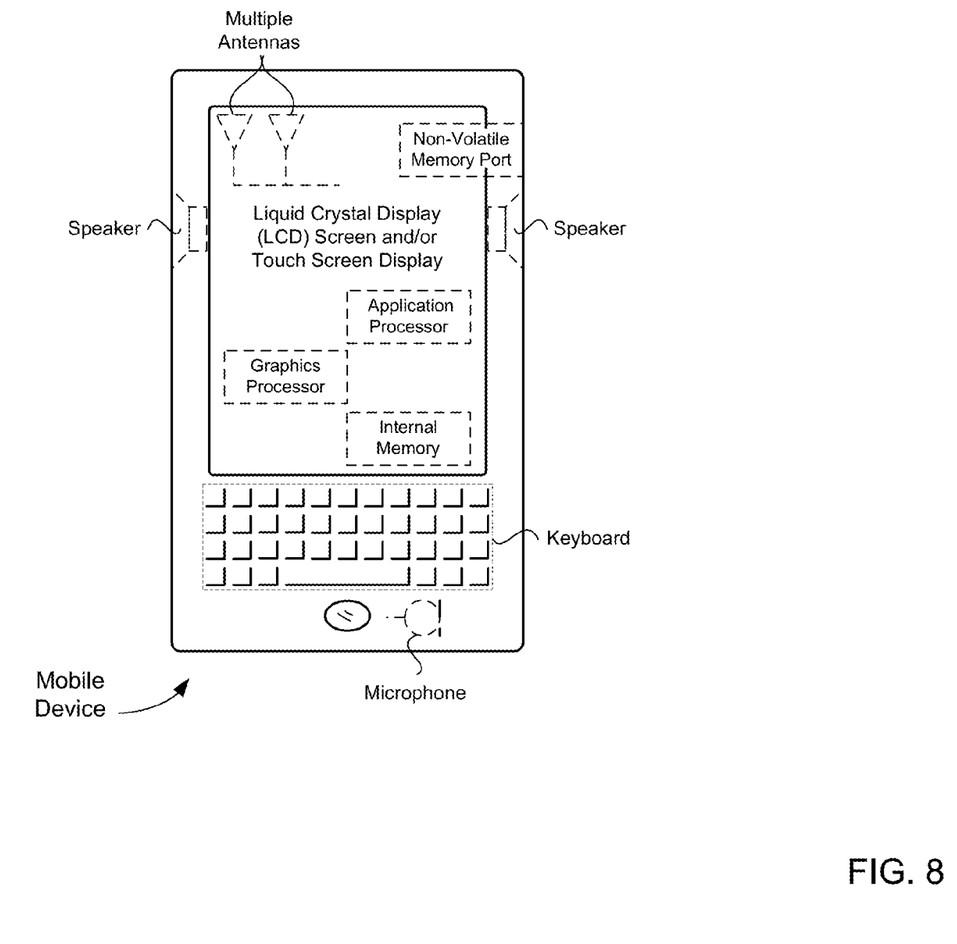
FIG. 8 illustrates a diagram of a mobile communication device in accordance to an embodiment.

FIG. 8 illustrates a diagram of a mobile communication device in accordance to an embodiment. FIG. 8 also provides an illustration of a microphone and one or more speakers that can be used for audio input and output from the mobile device. The display screen may be a liquid crystal display (LCD) screen, or other type of display screen such as an organic light emitting diode (OLED) display. The display screen can be configured as a touch screen. The touch screen may use capacitive, resistive, or another type of touch screen technology. An application processor/controller and a graphics processor/controller can be coupled to internal memory to provide processing and display capabilities. A non-volatile memory port can also be used to provide data input/output options to a user. The non-volatile memory port may also be used to expand the memory capabilities of the mobile device. A keyboard may be integrated with the mobile device or wirelessly connected to the mobile device to provide additional user input. A virtual keyboard may also be provided using the touch screen.

Embodiments within the scope of the present disclosure may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that performs particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Although the above description may contain specific details, they should not be construed as limiting the claims in any way. Other configurations of the described embodiments of the disclosure are part of the scope of this disclosure. For example, the principles of the disclosure may be applied to each individual user where each user may individually deploy such a system. This enables each user to utilize the benefits of the disclosure even if any one of the large number of possible applications do not need the functionality described herein. In other words, there may be multiple instances of the components each processing the content in various possible ways. It does not necessarily need to be one system used by all end users. Accordingly, the appended claims and their legal equivalents should only define the disclosure, rather than any specific examples given.

We claim:

1. A time-to-digital converter (TDC) comprising:
a voltage controlled oscillator (VCO/DCO) to output a VCO/DCO signal;
a delay module configured to store, in a plurality of latches, samples of the VCO/DCO signal clocked by a periodic ring oscillator signal, wherein each latch is configured to generate an output of the sample, and each latch output represents an encoding of the quantized time difference between the VCO/DCO signal and the periodic ring oscillator signal; and
a plurality of decision units, some decision unit having first and second input ports and an output port providing an output signal, each first input port of the plurality of decision units connected to the VCO/DCO signal and each second input port of the plurality of decision units connected to the ring oscillator signal, wherein the output signal is indicative of time difference between the VCO/DCO signal and the ring oscillator signal;
wherein the outputs from the delay module and the plurality of decision units are combined to provide a high resolution output.

2. The time-to-digital converter (TDC) in accordance to claim 1, wherein the delay module is comprise of circuit elements selected from a group consisting of delay cell, flip-flop, array of delay elements, shift registers, or a combination thereof.

3. The time-to-digital converter (TDC) in accordance to claim 2, wherein the plurality of decision units comprise elements selected from a group consisting of flip-flop, comparator, latch, arbiter, register, adder, or combination thereof.

4. The time-to-digital converter (TDC) of claim 3, wherein the output from the plurality of decision units is scaled before it is combined with the output of the delay module.

5. The time-to-digital converter (TDC) of claim 4, wherein the output signal is a digitized value of the differences in rising or falling edges between the VCO/DCO signal and the ring oscillator signal at the first and second input port of the plurality of decision units.

6. The time-to-digital converter (TDC) of claim 4, wherein the delay module is configured as at least one of a shift register and the plurality of latches to form a cascade of flip flops, and each of the samples of the VCO/DCO clock includes digital state information.

7. The time-to-digital converter (TDC) of claim 4, wherein the number of latches is greater than the TDC sample number, and the TDC sample number is a positive integer of samples per VCO/DCO period.

8. A method for time-to-digital conversion (TDC), comprising:
triggering a ring oscillator with a reference signal edge to produce a clock with a period that is a selected ratio of a voltage-controlled oscillator (VCO/DCO) period;
sampling and storing in a plurality of register elements a VCO/DCO signal clocked by the periodic ring oscillator signal, wherein each delay element is configured to store the sample for a different time interval;
stochastically processing with a plurality of decision units a VCO/DCO signal clocked by the periodic ring oscillator signal, some decision units having first and second input ports and an output port providing an output signal, each first input port of the plurality of decision units connected to the VCO/DCO signal and each second input port of the plurality of decision units connected to the ring oscillator signal; and
IF the VCO/DCO signal and the ring oscillator signal are almost aligned THEN combining the stored register sample for the time interval and the stochastically processed output signal to provide a high resolution TDC output signal.

9. The method in accordance to claim 8, wherein the delay module is comprise of circuit elements selected from a group consisting of delay cell, flip-flop, array of delay elements, shift registers, or a combination thereof.

10. The method in accordance to claim 9, wherein the plurality of logic units comprise elements selected from a group consisting of flip-flop, latch, comparator, gate, arbiter, register, adder, or combination thereof.

11. The method of claim 10, wherein the output from the plurality of logic units is scaled before combining.

12. The method of claim 10, wherein the output signal is a digitized value of the differences in rising edges between the VCO/DCO signal and the ring oscillator signal at the first and second input port of the plurality of logic units.

13. The method (TDC) of claim 10, wherein the delay module is configured as at least one of a shift register and the plurality of latches to form a cascade of flip flops, and each of the samples of the VCO/DCO clock includes digital state information.

14. The method of claim 13, wherein the number of latches is greater than the TDC sample number, and the TDC sample number is a positive integer of samples per VCO/DCO period.

15. An all-digital phase locked loop (ADPLL), comprising:
a digital phase/frequency detector configured to integrate frequency error by comparing a frequency word input to a differentiated TDC output in a feedback loop which is proportional to a frequency difference between the frequency word and the differentiated TDC output;
a digital loop filter configured to generate a filtered phase error signal by low-pass filtering the phase error signal;
a VCO/DCO configured to generate a periodic VCO/DCO signal at a specified frequency, wherein the voltage or digital input is used to converge the VCO/DCO frequency to the specified frequency;
a delay module configured to store, in a plurality of latches, samples of the periodic VCO/DCO signal clocked a periodic ring oscillator signal, wherein each latch is configured to generate an output of the sample, and each latch output represents a time difference polarity between the periodic VCO/DCO signal and the periodic ring oscillator signal; and a plurality of decision units, some decision unit having first and second input ports and an output port providing an output signal, each first input port of the plurality of decision units connected to the VCO/DCO signal and each second input port of the plurality of decision units connected to the ring oscillator signal, wherein the output signal is indicative of time difference between the VCO/DCO signal and the ring oscillator signal;

an adder configured to generate a TDC output signal which combines the latch output from the delay module and the output signal from the plurality of decision units; and a differentiator configured to generate the differentiated TDC output by differentiating the TDC output signal.

16. The all-digital phase locked loop (ADPLL) in accordance to claim 15, wherein the delay module is comprise of circuit elements selected from a group consisting of delay cell, flip-flop, array of delay elements, shift registers, or a combination thereof.

17. The all-digital phase locked loop (ADPLL) in accordance to claim 16, wherein the plurality of decision units comprise elements selected from a group consisting of flip-flop, comparator, latch, arbiter, register, adder, or combination thereof.

18. The all-digital phase locked loop (ADPLL) in accordance to claim 17, wherein the output from the plurality of decision units is scaled before it is combined with the output of the delay module.

19. The all-digital phase locked loop (ADPLL) in accordance to claim 18, wherein the output signal is a digitized value of the differences in rising edges between the periodic VCO/DCO signal and the ring oscillator signal at the first and second input port of the plurality of decision units.

20. The all-digital phase locked loop (ADPLL) in accordance to claim 18, wherein the delay module is configured as at least one of a shift register and the plurality of latches to form a cascade of flip flops, and each of the samples of the VCO/DCO clock includes digital state information.

21. The all-digital phase locked loop (ADPLL) in accordance to claim 18, wherein the number of latches is greater than the TDC sample number, and the TDC sample number is a positive integer of samples per VCO/DCO period.

22. A non-transitory machine-accessible medium that provides instructions, which when accessed, cause a machine to perform operations, the non-transitory machine-accessible medium comprising:

code for causing at least one computer to, when triggered by a reference signal edge, clock from a triggered reference ring oscillator a periodic ring oscillator signal with a ring oscillator period that is a selected ratio of a voltage-controlled oscillator (VCO/DCO) period;

code for causing at least one computer to sample and store in a plurality delay elements a VCO/DCO signal clocked by the periodic ring oscillator signal, wherein each delay element is configured to store the sample for a different time interval;

code for causing at least one computer to stochastically process with a plurality of decision units a VCO/DCO signal clocked by the periodic ring oscillator signal, some decision unit having first and second input ports and an output port providing an output signal, each first input port of the plurality of decision units connected to the VCO/DCO signal and each second input port of the plurality of decision units connected to the ring oscillator signal; and code for causing at least one computer to perform the conditional statement that IF the VCO/DCO signal and the ring oscillator signal are almost aligned THEN combining the store sample for a different time interval and the stochastically processed output signal to provide a high resolution TDC output signal.

23. A time-to-digital converter (TDC) comprising:

a voltage controlled oscillator (VCO/DCO) to output a VCO/DCO signal;

a chain of cascaded delay elements configured to cumulatively delay the VCO/DCO signal to generate signals having respective delay amounts; and a plurality of decision units, some decision unit having first and second input ports and an output port providing an output signal, each first input port of the plurality of decision units connected to a respective delay amounts and each second input port of the plurality of decision units connected to a reference oscillator signal, wherein the output signal is indicative of time difference between the respective delay amounts and the reference oscillator signal;

wherein the outputs from the chain of cascaded delay elements and the plurality of decision units are combined to provide a high resolution output.

24. The time-to-digital converter (TDC) in accordance to claim 23, wherein the delay module is comprise of circuit elements selected from a group consisting of delay cell, flip-flop, array of delay elements, shift registers, or a combination thereof.

25. The time-to-digital converter (TDC) in accordance to claim 24, wherein the plurality of decision units comprise elements selected from a group consisting of flip-flop, comparator, latch, arbiter, register, adder, or combination thereof.

26. The time-to-digital converter (TDC) in accordance to claim 24, further comprising:

an adder and/or encoder configured to generate a TDC output from the plurality of decision units output signals.

* * * * *